United States Patent [19]
Chen et al.

[11] Patent Number: 5,610,942
[45] Date of Patent: Mar. 11, 1997

[54] DIGITAL SIGNAL TRANSCODER AND METHOD OF TRANSCODING A DIGITAL SIGNAL

[76] Inventors: Keping Chen, 2561 Scarth Court, Mississauga, Ontario, Canada, L5M 5L2; Richard A. Kupnicki, 21 Eveningside Road, Markham, Ontario, Canada, L3T 4K1

[21] Appl. No.: 399,525

[22] Filed: Mar. 7, 1995

[51] Int. Cl.$^6$ ............................ H04N 7/01; H03M 7/00
[52] U.S. Cl. ........................ 375/242; 341/61; 348/443; 364/715.03; 364/724.1
[58] Field of Search ................................ 375/242, 222, 375/244, 243; 370/49.5, 58; 364/724.1, 724.01, 715.03; 341/61; 348/443

[56] References Cited

U.S. PATENT DOCUMENTS

| 4,569,075 | 2/1986 | Nussbaumer | 381/29 |
|---|---|---|---|
| 4,825,448 | 4/1989 | Critchlow et al. | 375/222 |
| 4,845,497 | 7/1989 | Weick et al. | 341/75 X |
| 5,126,737 | 6/1992 | Torii | 341/61 |
| 5,258,939 | 11/1993 | Johnstone et al. | 364/724.1 |
| 5,274,372 | 12/1993 | Luthra et al. | 341/61 |
| 5,389,923 | 2/1995 | Iwata et al. | 341/61 |
| 5,396,489 | 5/1995 | Harrison | 370/50 |
| 5,444,495 | 8/1995 | Takahama et al. | 348/443 |

*Primary Examiner*—Stephen Chin
*Assistant Examiner*—Bryan Webster
*Attorney, Agent, or Firm*—Mark B. Eisen

[57] ABSTRACT

A method and device for transcoding a digital signal first oversamples the input signal, converts the sampling rate to an oversampled output signal, filters the signal to reduce unwanted bands and decimates the oversampled output signal to produce a transcoded signal having the target sampling rate. This allows the conversion to be implemented in the composite domain, requiring a single sampling rate converter, and significantly reduces the complexity of the filter required to filter the output signal.

14 Claims, 8 Drawing Sheets

DIGITAL SIGNAL TRANSCODER AND METHOD OF TRANSCODING A DIGITAL SIGNAL

FIELD OF INVENTION

This invention relates to digital video transcoding. In particular, this invention relates to an oversampling rate converter for transcoding an input digital signal which converts the sampling rate of an input signal to a signal at a different sampling rate, using a single sampling rate converter and filters of substantially reduced complexity and improved performance.

BACKGROUND OF THE INVENTION

In many video applications it is desirable to convert a digital signal from one sampling rate to another, according to the format requirements of different devices. The conversion of video signals between composite and component formats requires an encoder or a decoder, depending upon the direction of the conversion, and a sampling rate converter.

In such a conversion polyphase filters are used to calculate data values for the signal at times other than the initial sampling times, which requires a separate filter for each sample subphase. However, component and composite sampling rates do not have simple integer ratios between the sampling frequencies. Thus, large finite impulse response (FIR) filters, mainly implemented in polyphase structure, are required to interpolate and decimate the input signal to achieve the desired sampling rate.

Conventional sampling rate converters are implemented in the component domain. This requires a separate complex rate converter for each of the three components of the signal and very large and complex low-pass filters.

FIGS. 1 and 2 illustrate a conventional sampling rate conversion from 4:2:2 with a sampling frequency $F_s$ of 13.5 MHz to 4fsc with a converted sampling frequency $F_c$ of 14.3 MHz. The conventional transcoder for this conversion is illustrated in FIG. 2. FIG. 1 illustrates the steps through the conversion process, in which the signal is interpolated at a 35:1 rate and a large polyphase FIR filter is used to remove unwanted bands in the component domain. The signal is then clocked out of the polyphase filter at the 14.3 MHz rate.

This approach presents a considerable problem in terms of the design of the required linear phase low-pass filter to meet the frequency domain specifications. The minimum length L of a linear low-pass FIR filter required to meet the frequency domain specifications is given by the following equation:

$$L = \frac{-20 \log (\delta_p \delta_s)^{-1/2} - 13}{14.6 \Delta F} + 1$$

where $\delta_p$ and $\delta_s$ are the passband and stopband ripples, respectively, and $\Delta F$ is the transition bandwidth.

If the maximum passband ripple is assumed to be 0.02 dB and the maximum stopband attenuation is assumed to be 60 dB, $\delta_p$ and $\delta_s$ become 0.0023 and 0.001, respectively. For a conventional sampling rate converter the transition bandwidth $\Delta F$ can be seen to be $\Delta F=(6.75-5.75)/(13.5\times 35)= 0.02116$, which results in a filter length L of 1404.

This problem becomes even more acute in the case of conversion to 4fsc with a sampling frequency of 17.7 MHz in the case of the PAL television standard, where the minimum filter length L is greater than 709,000. The complexity and costs associated with such a filter renders the design extremely impractical, if not impossible.

SUMMARY OF THE INVENTION

The present invention overcomes these problems by providing a digital signal transcoder having a sampling rate converter using polyphase filters which produce accurate signal conversion without requiring inordinately long and complex filters. The invention enables the conversion process to be carried out in the composite domain using a single sampling rate converter, which provides much better performance and far less complexity than the three converters required by conventional methods.

According to the invention the digital input signal is oversampled by an integer amount before interpolation and decimation by the sampling rate converter, which substantially reduces the complexity of the required sampling rate converter using the above example of a sample rate conversion from 4:2:2 with a sampling frequency $F_s$ of 13.5 MHz to 4fsc with a converted sampling frequency $F_c$ of 14.3 MHz, using a 1:2 interpolation for oversampling of the input signal the transition bandwidth becomes $\Delta F=(27-6.75-5.75)/(13.5\times 2\times 35)=0.1534$, which results in a minimum filter length L of 194. The required length of the FIR filter is thus decreased many times by implementing oversampling of the input signal before the conversion.

The present invention thus provides a transcoder for converting a digital input signal having a first sampling rate to a digital output signal having a target sampling rate, comprising means for oversampling the input signal to produce an oversampled signal, means for converting a sampling rate of the oversampled signal to produce an oversampled output signal, means for filtering the oversampled output signal to reduce unwanted signal bands, and means for decimating the oversampled output signal to produce a transcoded signal at the target sampling rate.

The present invention further provides a method of transcoding a digital input signal having a first sampling rate to a digital output signal having a target sampling rate, comprising oversampling the input signal to produce an oversampled signal, converting a sampling rate of the oversampled signal to produce an oversampled output signal, filtering the oversampled output signal to reduce unwanted signal bands, and decimating the oversampled output signal to produce a transcoded signal at the target sampling rate.

BRIEF DESCRIPTION OF THE DRAWINGS

In drawings which illustrate by way of example only a preferred embodiment of the invention.

DETAILED DESCRIPTION OF THE INVENTION

Figure 1:
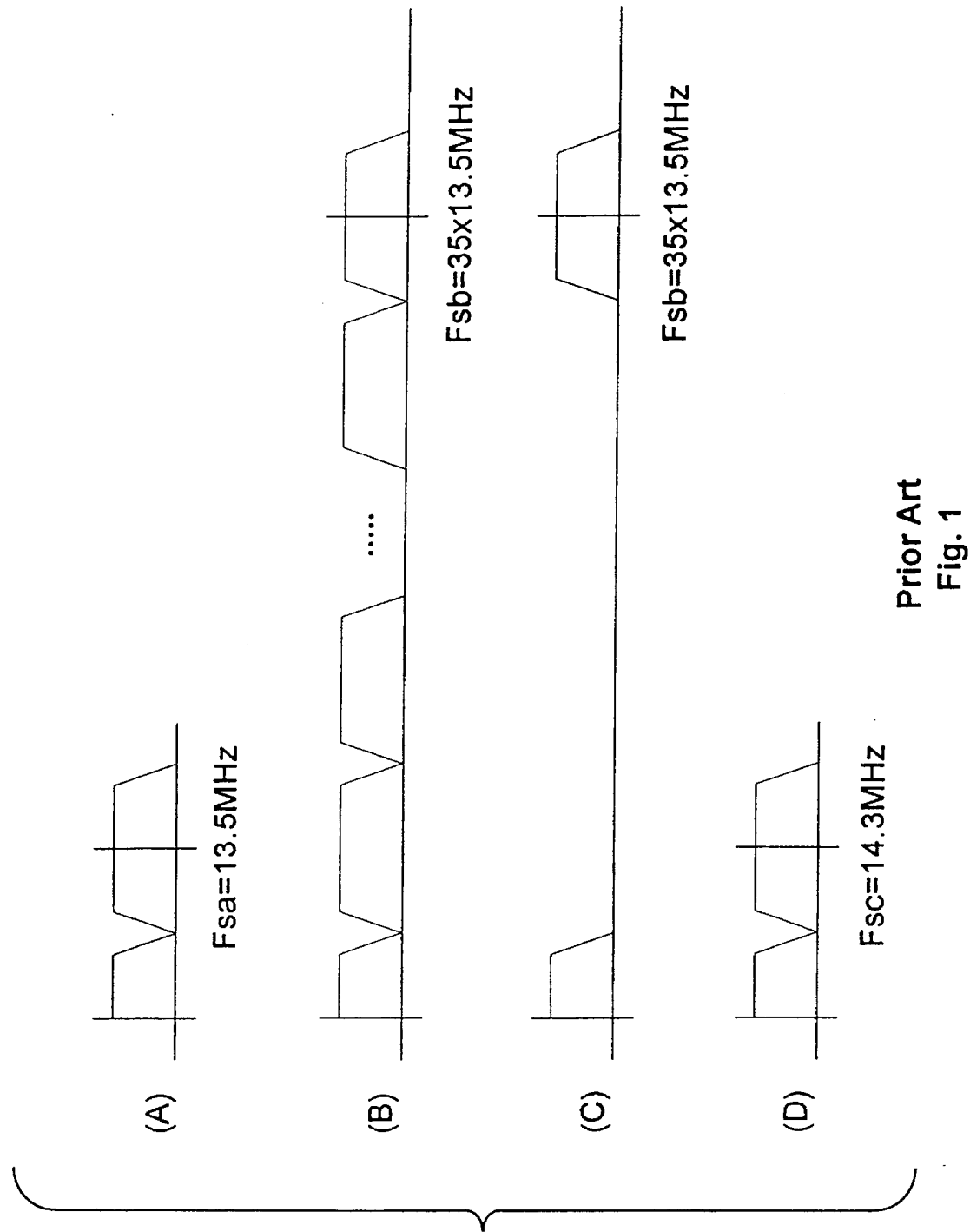
FIG. 1 is a graphic representation of the spectrum progression of a signal conversion according to the conventional method.
Figure 2:
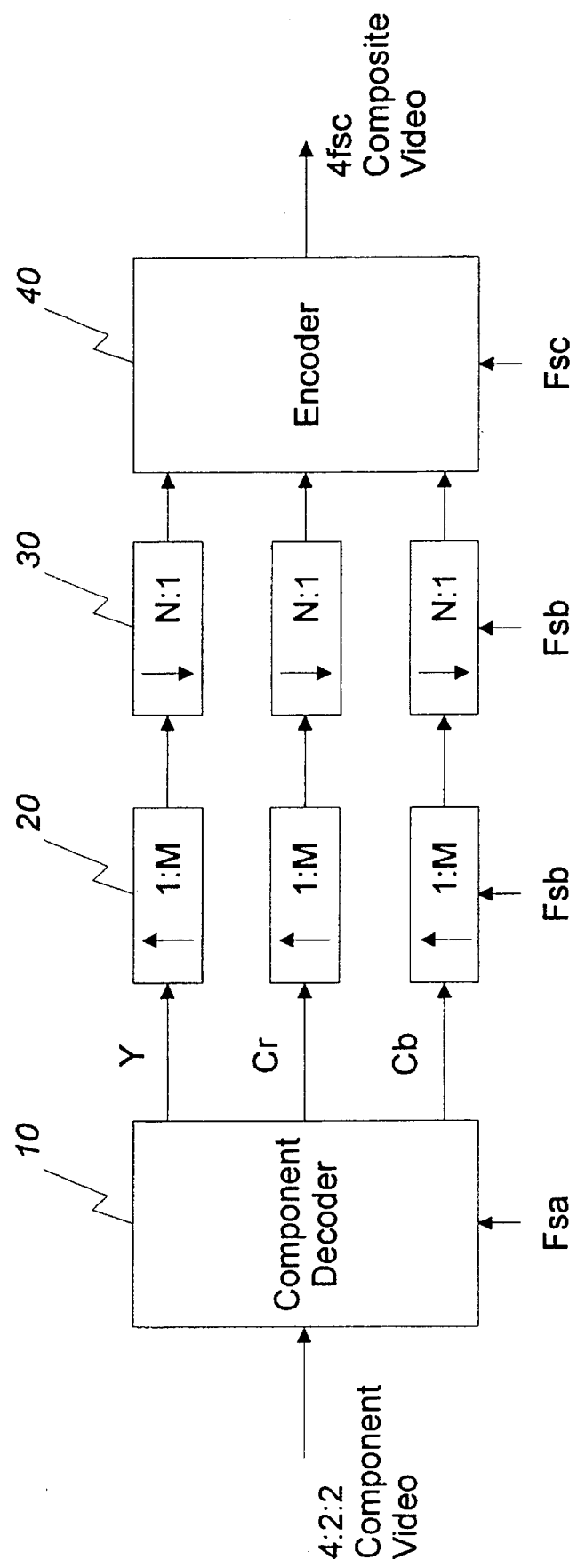
FIG. 2 is a block diagram illustrating the conventional transcoder for the method shown in FIG. 1.

FIGS. 1 and 2 respectively illustrate the spectrum progression and components of a conventional sample rate converter. As shown in FIG. 2, the input signal, in the example illustrated a 4:2:2 component signal with a sampling frequency $F_s$ of 13.5 MHz, is fed into a component decoder 10 which decodes the signal into its primary component parts. The three components of the signal are passed to an initial polyphase FIR filter 20 which interpolates the signal at 1:35. This signal is then passed to a second polyphase FIR filter 30 which decimates the signal at 33:1 in order to produce the required output at the target sampling frequency. The signal is then passed to an encoder 40 which converts the signal into a composite video signal.

Figure 3:
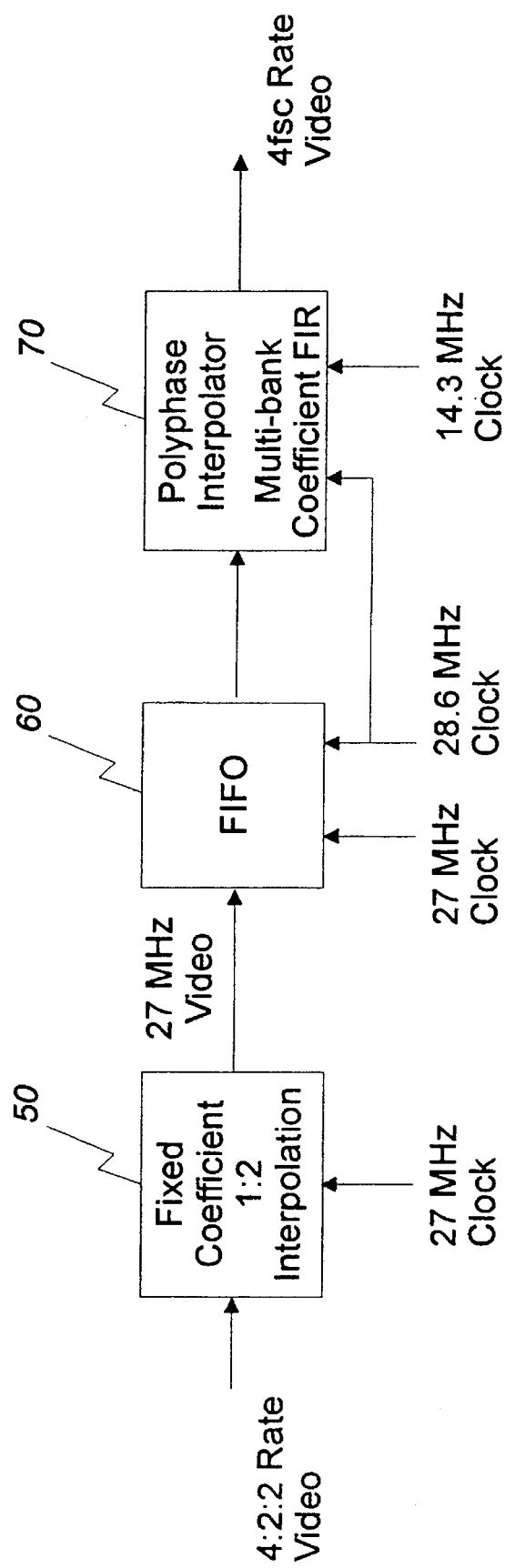
FIG. 3 is a block diagram illustrating a preferred embodiment of the signal transcoder of the invention.

According to the invention, an embodiment of which is illustrated in FIG. 3, the signal to be converted is first oversampled by being fed into a fixed coefficient interpolator 50 which produces a 1:K interpolation of the input signal, and outputs an oversampled signal at $K \times F_s$, where $F_s$ is the sampling rate of the unprocessed input signal and K is an integer greater than 1. The oversampled signal is then input to a FIFO buffer 60. The output of the FIFO buffer 60 is fed into a polyphase interpolator 70 whose input is clocked at the buffer output sampling rate of $K \times F_c$. The combination of the FIFO buffer 60 and the polyphase interpolator 70 eliminates the process of 1:M interpolation, eliminates unwanted frequency bands and provides the NK:1 decimation. The output is the signal at the target sampling frequency.

Figure 4:
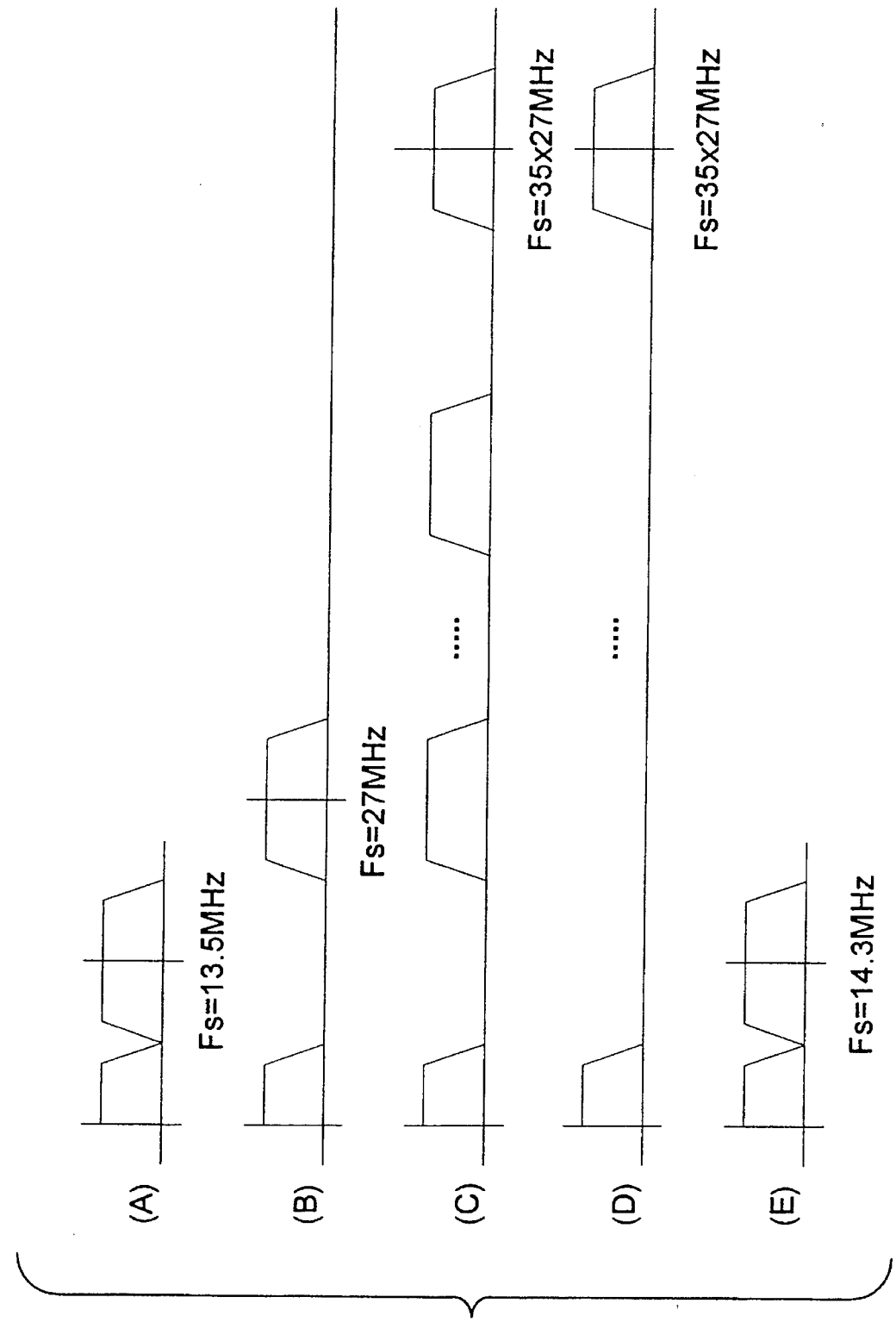
FIG. 4 is a graphic representation of the spectrum progression of a signal conversion according to the embodiment of FIG. 3.
Figure 5:
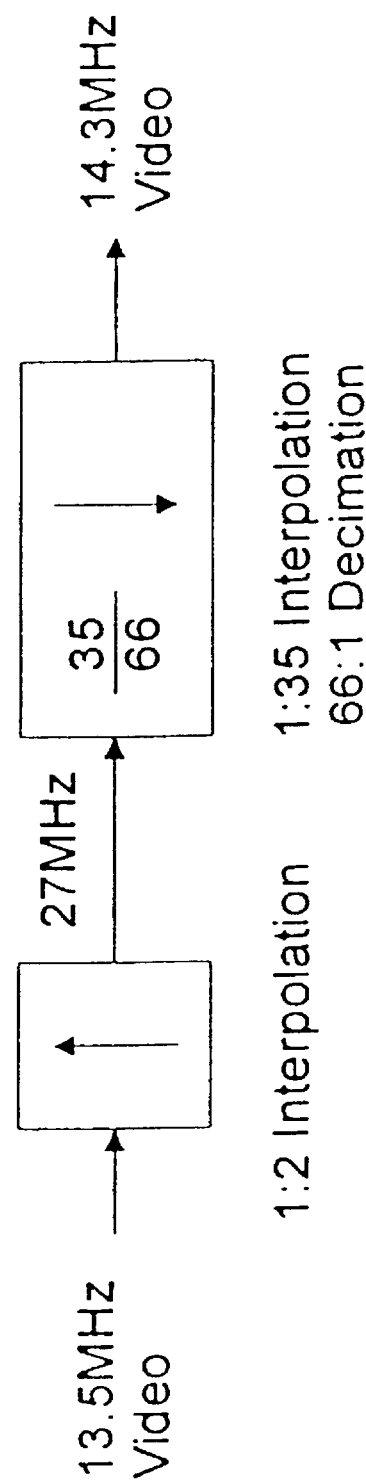
FIG. 5 is a block diagram illustrating the transcoding method for the embodiment of FIG. 3.

FIGS. 3 to 8 illustrate examples of a preferred embodiment of the invention. FIGS. 3 to 5 illustrate an embodiment of the invention converting a 4:2:2 video input signal to a 4fsc output signal. In order to significantly reduce the complexity of the converter, the 4:2:2 input signal is first fed into a fixed coefficient filter 50 which interpolates the input signal. In this example the filter 50 provides a 1:2 interpolation of the 13.5 MHz input signal to produce a digital output signal with a sampling frequency of 27 MHz, twice that of the input signal.

The interpolated output signal from the filter 50 is then fed into a FIFO buffer 60 having an input clock rate matching the sampling rate of the interpolated signal output from the filter 50, in this example 27 MHz. The FIFO buffer 60 has an output clock rate set at twice the signal sampling rate of the desired converted output signal, and thus outputs the converted signal at a sampling rate of 28.6 MHz to the polyphase interpolator 70.

The output clock for the FIFO buffer 60 is used as an input clock for the polyphase interpolator 70, which reduces unwanted bands and decimates the signal at 2:1 to output a signal at the desired transcoded signal sampling rate, 14.3 MHz.

Figure 6:
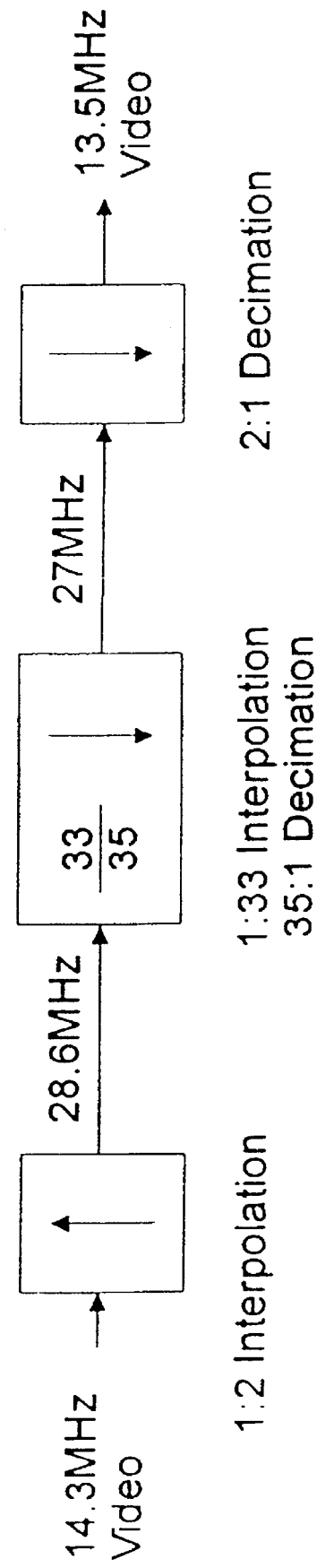
FIG. 6 is a block diagram illustrating a further example of the transcoding method of the invention.
Figure 7:
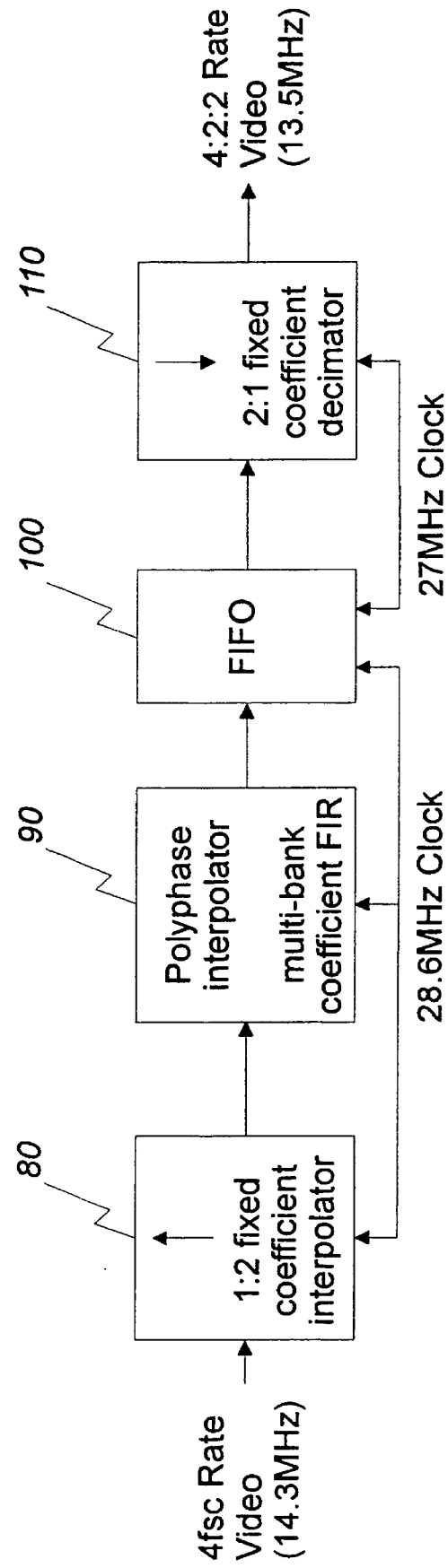
FIG. 7 is a block diagram illustrating a transcoder for the method of FIG. 6.
Figure 8:
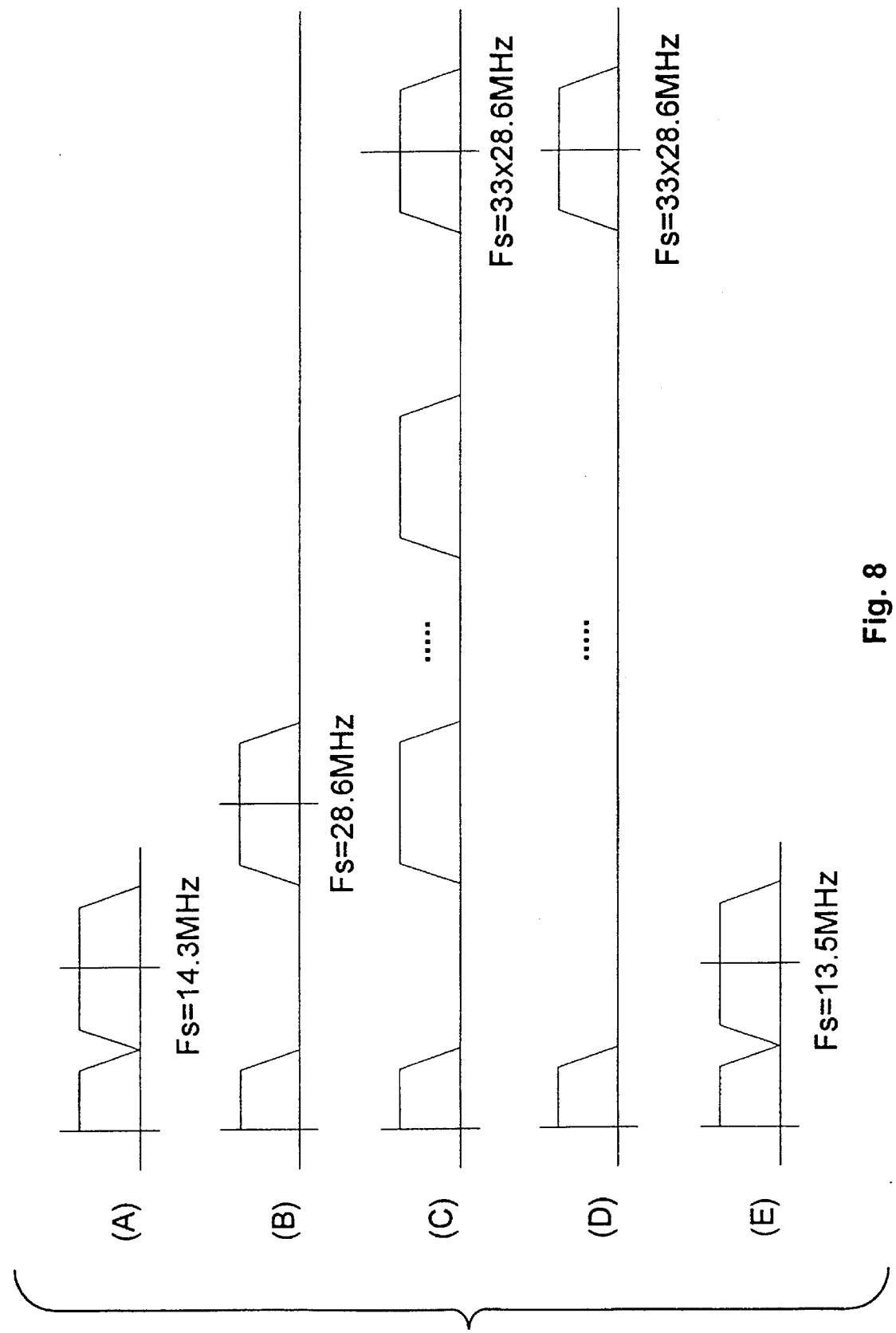
FIG. 8 is a graphic representation of the spectrum progression of a signal conversion according to the embodiment of FIG. 7.

FIGS. 6 to 8 illustrate another example of an embodiment of the invention, which converts a 4fsc video signal to a 4:2:2 signal, the reverse of the process in the above example. The input signal with a sampling rate of 14.3 MHz is fed to the input of a fixed coefficient filter 80 providing a 1:2 interpolation, to output an oversampled signal at 28.6 MHz, twice the sampling rate of the input signal. The input clock rate of polyphase interpolator 90 is the same clock rate of 28.6 MHz as is the input stage of FIFO buffer 100. After interpolation and decimation by the polyphase interpolator 90 which also removes unwanted bands the FIFO buffer 100 produces an output signal at a sampling rate of 27 MHz, twice that of the desired 4:2:2 output signal. The output clock for the FIFO buffer 100 is used as an clock for the fixed coefficient filter 110, providing a 2:1 decimation, to output a signal at 13.5 MHz, the desired output sampling rate.

It can thus be seen that by oversampling the input signal prior to processing to the converted format the minimum length L of the required polyphase filter is substantially reduced. The invention thus makes high quality video interpolation filters with fixed coefficients available at low cost.

The above examples utilize a 1:2 oversampling ratio, however the oversampling rate can be based on an interpolation with any integer K greater than 1, and the invention is in no way limited to the specific examples given. However, for video signals a smaller integer ratio, such as the 1:2 interpolation used in the example described, is preferred; because digital video is already sampled over 10 MHz, too large an integer K will make the interpolation filter difficult to implement. A reasonable upper limit for K in the case of digital video signals is 16.

We claim:

1. A transcoder for converting a digital input signal having a first sampling rate to a digital output signal having a target sampling rate, comprising:

means for oversampling the input signal to produce an oversampled signal having a second sampling rate which is an integer multiple of the first sampling rate in order to facilitate increased transition bandwidth in further processing;

means for converting the second sampling rate to produce an oversampled output signal having a third sampling rate which is an integer multiple of the target sampling rate, wherein the second sampling rate is not an integer multiple of the third sampling rate and the third sampling rate is not an integer multiple of the second sampling rate; and means for filtering and decimating the oversampled output signal to reduce unwanted signal bands and to produce a transcoded signal at the target sampling rate.

2. The transcoder of claim 1 wherein means for oversampling the input signal comprises a fixed coefficient interpolating filter.

3. The transcoder of claim 1, wherein the means for filtering and decimating comprises a polyphase filter.

4. The transcoder of claim 3 wherein the polyphase filter is a multi-bank coefficient finite impulse response filter.

5. The transcoder of claim 1, wherein the means for oversampling the input signal produces an oversampled signal having a second sampling rate which is twice the first sampling rate.

6. A method of transcoding a digital input signal having a first sampling rate to a digital output signal having a target sampling rate, comprising:

oversampling the input signal to produce an oversampled signal having a second sampling rate which is a multiple of two of the first sampling rate, in order to facilitate increased transition bandwidth in further processing;

converting a sampling rate of the oversampled signal to produce an oversampled output signal having a third sampling rate which is an integer multiple of the target sampling rate, wherein the second sampling rate is not an integer multiple of the third sampling rate and the third sampling rate is not an integer multiple of the second sampling rate;

filtering the oversampled output signal to reduce unwanted signal bands; and decimating the oversampled output signal to produce a transcoded signal at the target sampling rate.

7. The method of claim 6 wherein a fixed coefficient interpolating filter is used for oversampling the input signal.

8. The method of claim 6 wherein a polyphase filter is used for filtering the oversampled output signal.

9. The method of claim 8 wherein the polyphase filter includes means for decimating the oversampled output signal to produce a digital signal at the target sampling rate.

10. The method of claim 9 wherein the polyphase filter is a multi-bank coefficient finite impulse response filter.

11. A transcoder for converting a digital input signal having a first sampling rate to a digital output signal having a target sampling rate which is not an integer multiple of the first sampling rate, comprising:

means for oversampling the input signal to produce an oversampled signal having a second sampling rate which is twice the first sampling rate, in order to facilitate increased transition bandwidth in further processing;

means for converting the second sampling rate to produce an oversampled output signal having a third sampling rate which is an integer multiple of the target sampling rate; and means for filtering and decimating the oversampled output signal to reduce unwanted signal bands and to produce a transcoded signal at the target sampling rate.

12. The transcoder of claim 11 wherein the means for oversampling the input signal comprises a fixed coefficient interpolating filter.

13. The transcoder of claim 11 wherein the means for filtering and decimating comprises a polyphase filter including means for decimating the oversampled output signal to produce a digital signal at the target sampling rate.

14. The transcoder of claim 11 wherein the means for converting the second sampling rate comprises a FIFO buffer.

* * * * *